United States Patent [19]
Sim

[11] Patent Number: 6,025,617
[45] Date of Patent: Feb. 15, 2000

[54] MICROELECTRONIC DEVICES HAVING INCREASED IMPURITY CONCENTRATION BETWEEN A METAL SILICIDE CONTACT SURFACE

[75] Inventor: Sang-pil Sim, Kyungki-do, Rep. of Korea

[73] Assignee: Samsung Electronics Co., Ltd., Rep. of Korea

[21] Appl. No.: 08/899,554

[22] Filed: Jul. 24, 1997

[30] Foreign Application Priority Data

Aug. 8, 1996 [KR] Rep. of Korea ............. 96-33045

[51] Int. Cl.[7] ................................................. H01L 29/80
[52] U.S. Cl. ......................... 257/285; 257/734; 257/767
[58] Field of Search ................................. 257/767, 285, 257/336, 344, 355, 382, 408, 734

[56] References Cited

U.S. PATENT DOCUMENTS 5,672,890  9/1997  Nakajima ........................... 257/285
5,719,425  2/1998  Akram et al. ...................... 257/336
5,856,693  1/1999  Onishi ................................. 257/336

Primary Examiner—Carl Whitehead, Jr.
Assistant Examiner—Roy Potter
Attorney, Agent, or Firm—Myers Bigel Sibley & Sajovec

[57] ABSTRACT

A microelectronic device includes a first region having a first conductivity type. A second region having a second conductivity type contacts the first region at a junction therebetween. A metal silicide region contacts the second region at a contact surface apart from the junction. Impurities of the second conductivity type in the second region are concentrated between the contact surface and the junction, for example, in one or more subregions disposed between the contact surface and the junction. The subregions may include a first subregion adjacent the junction formed by an ion implantation at a first energy level, and a second subregion disposed between the first subregion and the contact surface formed by a second ion implantation at a different energy level. Related fabrication methods are also provided.

11 Claims, 3 Drawing Sheets

MICROELECTRONIC DEVICES HAVING INCREASED IMPURITY CONCENTRATION BETWEEN A METAL SILICIDE CONTACT SURFACE

FIELD OF THE INVENTION

The present invention relates to microelectronic devices and methods of fabrication therefor, more particularly, to contact structures for microelectronic devices and methods of fabrication therefor.

BACKGROUND OF THE INVENTION

As semiconductor devices have become more highly integrated, fabrication of devices having a high speed has become more desirable. In order to lower resistance of structures such as gate electrodes and source/drain contacts in devices such as static random access memories (SRAMs) and logic devices, materials having low resistivity, e.g., suicides compounds of metal and silicon, have been widely used.

FIGS. 1A through 1D are sectional views which illustrate a conventional self-aligned silicide (silicide) process. Referring to FIG. 1A, a gate insulating film 4 and a polysilicon gate electrode 6 are formed in an active region of a semiconductor substrate 2. An insulating layer is then deposited on the resultant structure and anisotropically etched to form spacers 8 on the sidewalls of the gate electrode 6. Using the spacers 8 and the gate electrode 6 as an ion-implantation mask, impurities are then implanted into the semiconductor substrate 2 to thereby form a source/drain region 10.

Referring to FIGS. 1B and 1C, a refractory metal layer 12, e.g., a titanium (Ti) or cobalt (Co) layer, is deposited and heat treated to thereby form silicide regions 12a, 12b, the silicide being a heat-treated compound of silicon and the refractory metal, such as titanium silicide ($TiSi_2$) or cobalt silicide ($CoSi_2$). As illustrated, the silicide regions 12a, 12b are formed where the refractory metal layer 12 contacts silicon, i.e., on the source/drain regions 10 and the gate electrode 6. The unreacted refractory metal may subsequently be removed, thus allowing the silicide regions 12a, 12b to be formed without an additional photolithography process. The silicide region 12a on the gate electrode 6 can reduce the sheet resistance of the gate electrode 6 and the silicide region 12b formed on the surface of the source/drain region 10 can reduce contact resistance between the source/drain region 10 and an interconnection region. Referring to FIG. 1D, a planarized interlayer dielectric film 14 may subsequently be formed on the resultant structure of FIG. 1C, and a photolithography process performed to form contact holes for connecting the gate electrode 6 and the source/drain regions 10 to subsequently formed regions.

However, if subsequent processing involves heat treatment, problems may arise. As shown in FIG. 2, agglomeration or encroachment of silicide may occur at a contact portion of the source/drain 10 and a barrier layer 16 (or an interconnection region 18, if the barrier layer 16 is not present), thereby attacking an interface A between the source/drain region 10 and the substrate 2. This may cause excessive junction leakage current, increasing power consumption of a device and deteriorating its reliability. Moreover, the silicide regions usually absorb a great deal of impurities, especially boron, from the substrate during formation and during subsequent heat treatment. Consequently, at an interface between an interconnection region and a source/drain region doped with a P-type impurity such as boron, the concentration of boron at the interface between the source/drain region and the interconnection region may be decreased due to absorption by the silicide, thus increasing contact resistance between the source/drain region and the interconnection region. The increase in the contact resistance can deteriorate the speed of the device.

SUMMARY OF THE INVENTION

In light of the foregoing, it is an object of the present invention to provide microelectronic devices with improved contact structures and methods of fabrication therefor.

It is another object of the present invention to provide microelectronic devices having contact structures which are less likely to suffer increased leakage currents due to attack by encroaching silicide or metal.

It is yet another object of the present invention to provide microelectronic devices having contact structures which are less vulnerable to contact resistance degradation by impurity absorption by silicide regions.

These and other objects, features and advantages are provided according to the present invention by microelectronic devices having contact structures in which a first semiconductor region, e.g., a substrate, forms a junction which a second semiconductor region, e.g., a source/drain region formed in the substrate, and impurities in the second semiconductor region are concentrated between the junction and a surface at which the second semiconductor region contacts a metal silicide region. One or more subregions having higher impurity concentration may be formed in the second semiconductor region between the silicide region and the junction using, for example, ion implantation. The presence of one or more increased concentration subregions can help prevent encroaching silicide or other conductive material from increasing leakage current through the junction, and can also help compensate for absorption of impurities from the second semiconductor region into the silicide region. In this manner, contact resistance between the second semiconductor region and the silicide region can be reduced.

In particular, according to the present invention, a microelectronic device includes a first region having a first conductivity type. A second region having a second conductivity type contacts the first region at a junction therebetween. A metal silicide region contacts the second region at a contact surface apart from the junction. Impurities of the second conductivity type are concentrated between the contact surface and the junction, for example, in one or more subregions disposed between the contact surface and the junction. The subregions may include a first subregion adjacent the junction formed by an ion implantation at a first energy level, and a second subregion disposed between the first subregion and the contact surface formed by a second ion implantation at a different energy level.

According to an embodiment of the present invention, a semiconductor device includes a semiconductor substrate including a first region of a first conductivity type and a second region of a second conductivity type, the second region extending from a surface of the substrate into the substrate to contact the first region at a semiconductor junction. A metal silicide region is disposed on the second region. Impurities of the second conductivity type are concentrated between the metal silicide region and the semiconductor junction, for example, in one or more subregions of the second region disposed between the metal silicide region and the semiconductor junction. A dielectric layer may be disposed on the substrate, the dielectric layer having an opening therein which overlies the metal silicide region.

An interconnection region may be disposed on the dielectric layer, extending through the opening in the dielectric layer to contact the metal silicide region.

According to method aspects of the present invention, a contact structure is fabricated for a microelectronic device which includes a first region of a first conductivity type and a second region of a second conductivity type, the first and second regions joining to form a junction. A metal silicide region is formed on the second region. Impurities of the second conductivity type are concentrated between the junction and the metal silicide region, either before or after the metal silicide region is formed. Impurities may be concentrated by forming one or more subregions within the second region, between the junction and the metal silicide region, the one or more subregions having a higher concentration of impurities of the second conductivity type than adjacent portions of the second region. The one or more subregion may be formed by implanting ions of the second conductivity type into the second region. First and second subregions may be formed by implanting ions of the second conductivity type at a first energy level to form the first subregion and implanting ions of the second conductivity type at a second energy level to form the second region.

According to one method aspect, a microelectronic device is formed by forming a semiconductor substrate including a first region of a first conductivity type and a second region of a second conductivity type, the second region extending from a surface of the substrate into the substrate to contact the first region at a semiconductor junction. A metal silicide region is formed on the second region, and impurities of the second conductivity type are concentrated in a portion of the second region between the silicide region and the semiconductor junction. Impurities may be concentrated by implanting ions of the second conductivity type into the second region, before or after forming the metal silicide region. A plurality of subregions may be formed in the second region, between the junction and the metal silicide region, the plurality of subregions having a higher concentration of impurities of the second conductivity type than adjacent portions of the second region. Implantation may be preceded by forming a dielectric layer on the substrate, the dielectric layer having an opening therein which overlies a portion of the second region. Ions of second conductivity type may be implanted into the second region through the opening in the dielectric layer. An interconnection region may be formed on the dielectric layer, the interconnection region extending through the opening in the dielectric layer to contact the metal silicide region. Improved contact structures may thereby be provided.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF THE INVENTION

Figure 1A:
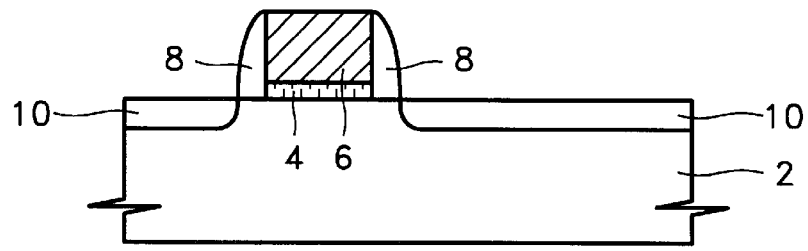
FIGS. 1A–1D are cross-sectional views of intermediate fabrication products illustrating a method of fabricating a semiconductor device using a conventional silicide process.
Figure 1B:
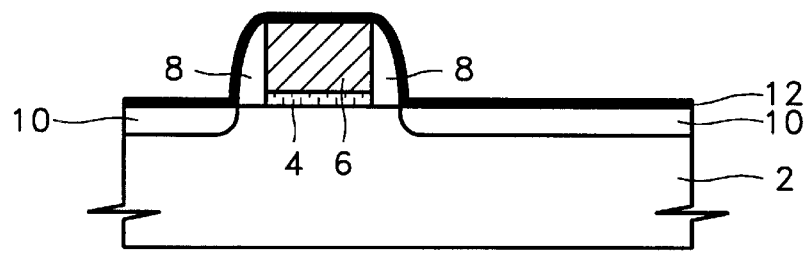
Figure 1C:
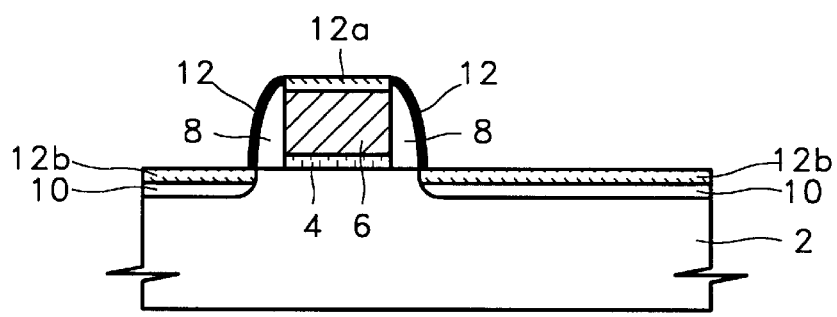
Figure 1D:
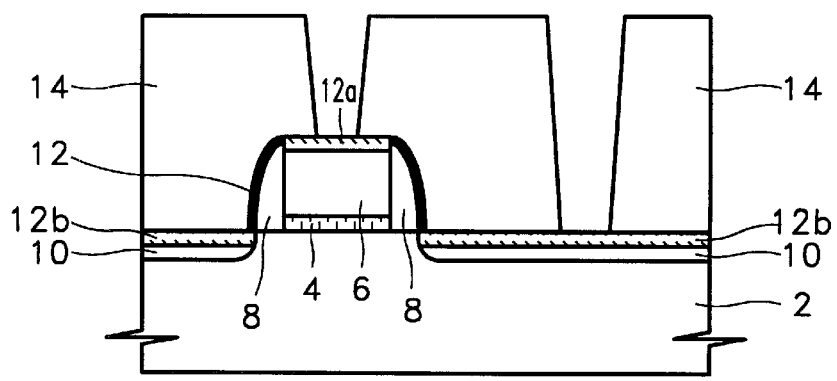
Figure 2:
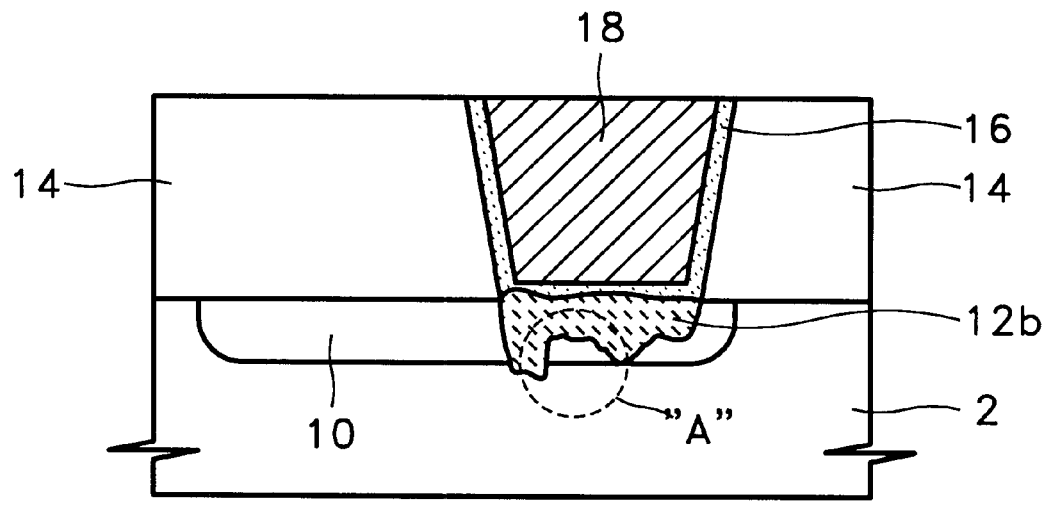
FIG. 2 is a cross-sectional view illustrating a semiconductor device fabricated according to the process of FIGS. 1A–1D.

The present invention now will be described more fully hereinafter with reference to the accompanying drawings, in which embodiments of the invention are shown. Those skilled in the art will appreciate that the invention may be embodied in many different forms and should not be construed as limited to the embodiments set forth herein; rather, these embodiments are provided so that this disclosure will be thorough and complete, and will fully convey the scope of the invention to those skilled in the art. In the drawings, thickness of regions and layers may be exaggerated for purposes of clarity, and like numbers refer to like elements throughout. Those skilled in the art will appreciate that although the description herein refers to microelectronic devices having specific configurations of "n-type" and "p-type" regions, the present invention also includes complementary devices.

Figure 3A:
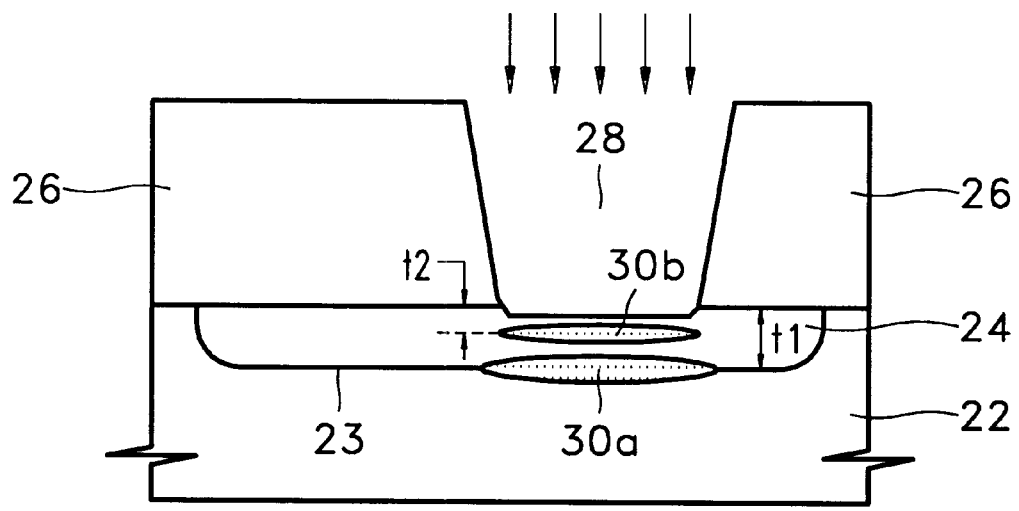
FIGS. 3A–3B are cross-sectional views of intermediate fabrication products illustrating operations for fabricating a microelectronic device according to the present invention.

Referring to FIG. 3A, a semiconductor substrate includes a first region 22 of a first conductivity type and a second region, e.g., a source/drain region 24 of a second conductivity type extending into the substrate to contact the first region 22 at a junction 23. A dielectric layer 26 is then formed and etched to form a contact hole 28 which exposes the source/drain region 24.

Impurities of the same conductivity type as the source/drain region 24 are then implanted into the source/drain region 24 through the contact hole 28, forming a first subregion 30a. Implantation energy is preferably controlled during ion-implantation of the impurities such that the impurities of the source/drain region 24 are concentrated in a portion of the source/drain region 24 between the junction 23 and the surface of the source/drain region 24, increasing the junction depth of the source/drain region 24. For example, considering that a junction depth t1 of a source/drain region for a typical very large scale integrated circuit (VLSI) is approximately 0.1 $\mu$m–1.0$\mu$m, when the source/drain region 24 is doped with P-type impurities, P-type impurities such as $BF_2$ or B are preferably ion-implanted at a dose of $1\times10^{14}$ to $1\times10^{16}$ ion/cm$^2$ and with an energy of approximately 60 KeV.

After the first implantation, a second ion-implantation process is performed through the contact hole 28 with reduced energy to form a second subregion 30b. For example, if the first subregion is formed at an energy of 60 KeV, an energy of approximately 30 KeV may be used to create a second subregion 30b which is positioned at a depth t2, between the first subregion 30a and bottom surface of the contact hole 28. Those skilled in the art will appreciate that the order of formation of the first and second subregions 30a, 30b may be reversed, and that the subregions 30a, 30b may be formed after a subsequent silicidation process which is described below. If the subregions 30a, 30b are formed after the silicidation process, implantation energy preferably is controlled so that impurity ions passing through a silicide layer formed on the surface of the source/drain region 24 have an appropriate penetration depth.

Figure 3B:
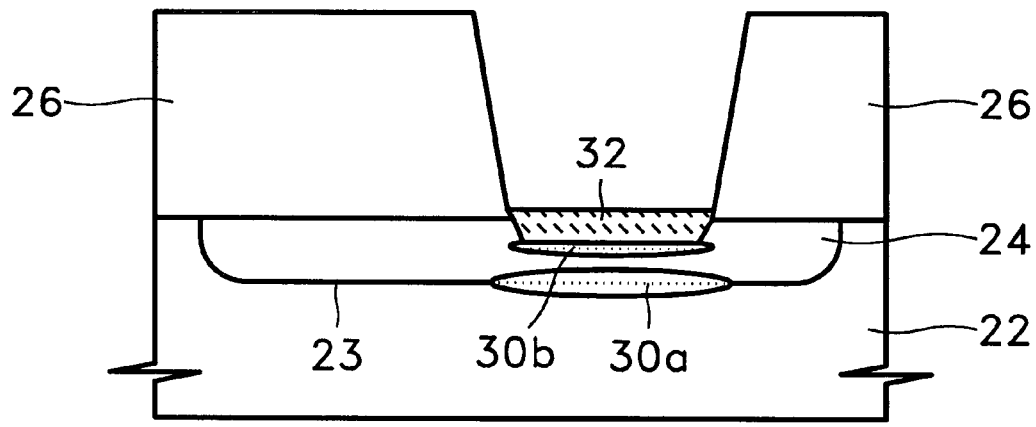

Referring to FIG. 3B, a refractory metal, for example, titanium (Ti), is deposited to a thickness of 500 Å or less. A titanium silicide region ($TiSi_2$) 32 is then formed by heat treatment, with unreacted residual titanium being removed using sulfuric acid. The thickness of silicon exhausted by the silicidation may be around 500 Å. The depth of the second subregion 30b is preferably controlled such that the second subregion 30b is positioned between the bottom surface of the contact hole 28 and the first subregion 30a. In this manner, an undesirable increase in contact resistance caused by absorption of impurities by the silicide region 32 can be prevented.

Figure 3C:
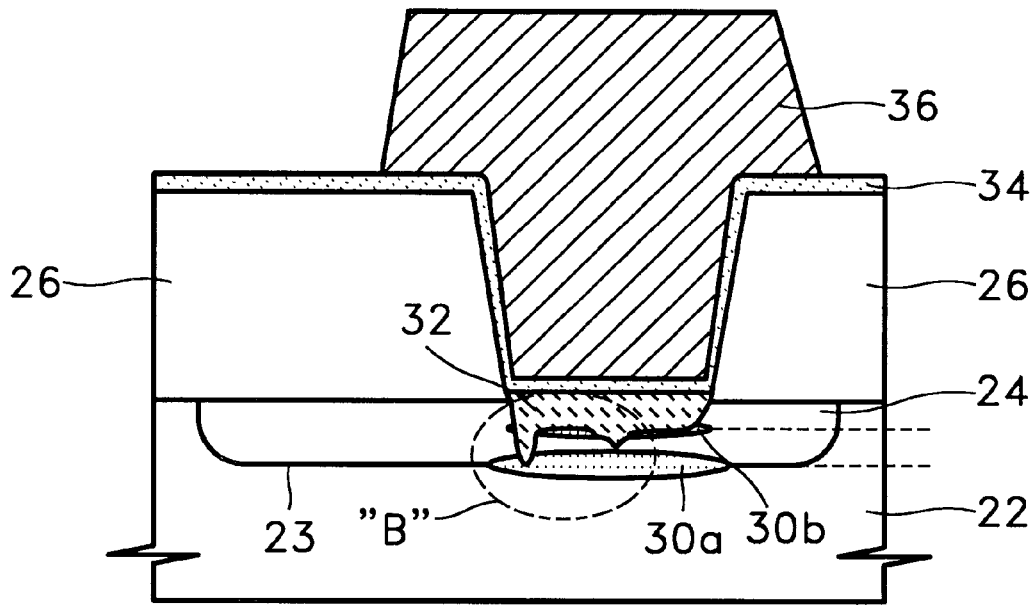
FIG. 3C is a cross-sectional view illustrating a microelectronic device according to the present invention.

Referring to FIG. 3C, a layer of barrier material for preventing mutual diffusion between the substrate and an interconnection region, for example, titanium nitride (TiN), is then deposited to cover the silicide region 32, thereby forming a barrier layer 34. A conductive material, for example, tungsten (W) or aluminum (Al) is then deposited, heat-treated and patterned to form an interconnection region 36.

As illustrated in FIG. 3C, impurities are laterally concentrated at a portion of the source/drain region 24 between the silicide region 32 and the junction 23 in subregions 30a, 30b. The locally increased impurity concentration can protect the junction 23 from attack even if the silicide region 32 or the interconnection region 36 becomes agglomerated or encroaches upon the source/drain region 24 during heat treatment. Those skilled in the art will appreciate that although locally increased impurity concentration is preferably achieved by implanting ions to form increased-concentration subregions, other techniques for locally increasing impurity concentration may be employed within the scope of the present invention. For example, a source/drain region 24 having impurities concentrated in a portion thereof may be formed as a composite of subregions of different impurity concentrations formed in separate deposition processes, with higher concentration subregions being formed between the silicide region 32 and the junction 23 and lower concentration subregions being formed lateral to the higher concentration subregions.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A microelectronic device, comprising:
   a first region having a first conductivity type;
   a second region having a second conductivity type, contacting said first region at a junction therebetween; and
   a metal silicide region contacting said second region at a contact surface apart from said junction,
   wherein impurities of said second conductivity type are concentrated at a higher concentration in a portion of said second region underlying said contact surface than elsewhere in said second region.

2. A device according to claim 1, wherein impurities of said second conductivity type are concentrated in a subregion of said second region disposed between said contact surface and said junction.

3. A device according to claim 2, wherein impurities of said second conductivity type are concentrated in a plurality of subregions of said second region disposed between said junction and said contact surface.

4. A device according to claim 3, wherein said plurality of subregions comprises a first subregion adjacent said junction and a second subregion disposed between said first subregion and said contact surface.

5. A device according to claim 1, wherein said second region comprises a source/drain region of a transistor.

6. A semiconductor device, comprising:
   a semiconductor substrate including a first region of a first conductivity type and a second region of a second conductivity type, said second region extending from a surface of said substrate into said substrate to contact said first region at a semiconductor junction; and
   a metal silicide region on said second region,
   wherein impurities of said second conductivity type are concentrated at a higher concentration in a portion of said second region underlying said metal silicide region than elsewhere in said second region.

7. A device according to claim 6, wherein impurities of said second conductivity type are concentrated in a subregion of said second region disposed between said metal silicide region and said semiconductor junction.

8. A device according to claim 7, wherein impurities of said second conductivity type are concentrated in a plurality of subregions of said second region disposed between said metal silicide region and said semiconductor junction.

9. A device according to claim 8, wherein said plurality of subregions comprises a first subregion adjacent said semiconductor junction and a second subregion disposed between said first subregion and said metal silicide region.

10. A device according to claim 6, further comprising:
    a dielectric layer on said substrate, said dielectric layer having an opening therein which overlies said metal silicide region; and
    an interconnection region on said dielectric layer, said interconnection region extending through said opening in said dielectric layer to contact said metal silicide region.

11. A device according to claim 6, wherein said second region comprises a source/drain region of a transistor.

* * * * *